United States Patent

Bakowski et al.

Patent Number: 5,932,894
Date of Patent: Aug. 3, 1999

[54] SIC SEMICONDUCTOR DEVICE COMPRISING A PN JUNCTION

[75] Inventors: Mietek Bakowski, Skultuna; Ulf Gustafsson, Linkoping; Christopher I. Harris, Sollentuna, all of Sweden

[73] Assignee: ABB Research Ltd., Zurich, Switzerland

[21] Appl. No.: 08/883,106

[22] Filed: Jun. 26, 1997

[51] Int. Cl.$^6$ .................. H01L 31/0256; H01L 31/0312
[52] U.S. Cl. ..................... 257/76; 257/77; 257/655; 257/657
[58] Field of Search .................. 257/76, 77, 657, 257/655; 438/931

[56] References Cited

U.S. PATENT DOCUMENTS

| | | | |
|---|---|---|---|
| 5,455,432 | 10/1995 | Hartsell et al. | 257/77 |
| 5,510,632 | 4/1996 | Brown et al. | 257/77 |
| 5,543,637 | 8/1996 | Baliga | 257/77 |
| 5,705,406 | 1/1998 | Rottner et al. | 437/22 |
| 5,763,905 | 6/1998 | Harris | 257/77 |

FOREIGN PATENT DOCUMENTS 5259443  8/1993  Japan ....................... 257/77

OTHER PUBLICATIONS

Bhatnagar et al., "Comparison of 6H—SiC, 3C—SiC, and Si for Power Devices," IEEE Transactions on Electron Devices, vol. 40, No. 3, Mar. 1993, pp. 645–655.

Neudeck et al., "2000 V 6H—SiC p–n junction diodes grown by chemical vapor deposition," Appl. Phys. Lett. 64, vol. 11, Mar. 1994, pp. 1386–1388.

*Primary Examiner*—William Mintel
*Attorney, Agent, or Firm*—Pollock, Vande Sande & Amernick

[57] ABSTRACT

A semiconductor device of planar structure, comprises a pn junction, formed of a first type conducting layer and on top thereof a second type conducting layer, both layers of doped silicon carbide, the edge of the second of the layers being provided with an edge termination (JTE), enclosing stepwise or continuously decreasing effective sheet charge density towards the outer border of the termination, wherein the pn junction and its JTE are covered by a doped or undoped SiC third layer.

16 Claims, 4 Drawing Sheets

Distance from center (arb. units)

Distance from center (arb. units)

SIC SEMICONDUCTOR DEVICE COMPRISING A PN JUNCTION

TECHNICAL FIELD

The invention relates to a semiconductor device of planar structure, consisting of doped silicon carbide (SiC), comprising a pn junction, formed of a first type conducting layer and a second type conducting layer, the edge of at least one of the layers being provided with an edge termination (JTE), enclosing stepwise or continuously decreasing effective sheet charge density towards the outer border of the termination.

BACKGROUND ART OF THE INVENTION

Semiconductor devices based on silicon carbide as the base material are continuously developed for use in connection with high temperatures, high power applications and under high radiation conditions. Under such circumstances conventional semiconductors do not work satisfactorily. Evaluations indicate that SiC semiconductors of power MISFET-type and diode rectifiers based on SiC are able to operate over a greater voltage and temperature interval, e.g. up to 650–800° C., and show better switching properties such as lower losses and higher working frequencies and nevertheless have a volume 20 times smaller than corresponding silicon devices. These possible improvements are based on the favorable material properties that silicon carbide possesses in relation to silicon, such as, for example a higher breakdown field (up to 10 times higher than silicon), a higher thermal conductivity (more than 3 times higher than silicon) and a higher energy band gap (2.86 eV for 6H—SiC, one of the crystal structures of SiC).

SiC semiconductor technology is relatively new and in many aspects immature. There are many critical manufacturing problems that need to be solved before SiC semiconductor devices may be realized experimentally and large scale manufacturing becomes a reality. This is especially true of devices intended for use in high-power and high-voltage applications.

One of the difficulties to overcome when manufacturing high voltage diodes or other types of semiconductor devices comprising a voltage absorbing pn junction is to produce a proper junction termination at the edge of the junction. The electric field at the periphery of the junction is normally enhanced compared to the electric field in the bulk of the junction. This field increase at the periphery of the junction may be further reinforced in the presence of surface charge. A high electric field at the edge of the pn junction results in a great risk of voltage breakdown or flash-over at the edge of the junction and gives rise to an instability of the blocking voltage known as voltage drift.

To avoid the above-mentioned disadvantages it becomes very important to reduce the field concentration where the junction reaches the surface. Combined with efforts to passivate the surface of the device, measures are taken to flatten the electric field at the surface e.g. by influencing how the pn junction emerges at the surface. As an example, it is known from silicon power devices to lap (grind, sandblast, etch) the surface of the edge to a certain angle in relation to the pn junction to thereby flatten the field. Another known technique is to gradually decrease the charge content on the highly doped side of the junction, in such a way that the charge content of the highly doped layer is reduced towards the outermost edge of the junction, a so called Junction Termination Extension, (JTE). The methods, known from silicon technology, used to achieve a JTE of an Si device cannot always be directly transferred to devices with SiC as the base material, primarily due to the great hardness of SiC and extremely low diffusivity of proper SiC dopants. Ion implantation of doping elements, a common technique used in manufacturing Si devices, is difficult to master and not yet fully developed for SiC but is still perhaps the most promising method for doping of SiC. However, ion implantation introduces damage to the SiC crystal, which is a factor to be considered.

High voltage diodes from 6H—SiC with epitaxially formed pn and Schottky junctions have been made experimentally (see e.g. M. Bhatnagar and B. J. Baliga, IEEE Trans. Electron Devices, Vol. 40, No. 3 pp 645–655, March 1993 or P. G. Neudeck, D. J. Larkin, J. A. Powell, L. G. Matus and C. S. Salupo, Appl. Phys. Lett. Vol 64, No 11, Mar. 14, 1994, pp 1386–1388). Some of the problems related to SiC devices have thus been solved, but no reliable solution to the problems connected with electric field concentration at the edges of the junction has been presented as yet.

Any method or device to accomplish a semiconductor device corresponding to the principle of Junction Termination Extension at a pn junction composed of Si is not known for a device, where SiC constitutes the base material of the junction. Solutions for arriving at SiC devices comprising pn junctions with planar JTEs are described in the unpublished patent application U.S. 08/683 059, which is hereby included in this description by reference. The solutions described there involve stepwise decreasing charges of the JTE towards the edge by ion implantation of concentric regions, also called zones, of the JTE in order to control the surface doping and surface fields. A consecutive passivating layer has to be grown or deposited on a surface which is structurally damaged by the ion implantation.

SUMMARY OF THE INVENTION

The present invention aims at providing a JTE structure of an SiC device where the pn junction and its JTE have a planar structure and where the above described problems are avoided. Another aim of the invention is to minimize the electric field at the surface of the component. A low lateral electric field at the interface of a device surface to a passivation layer is vital to the proper function of the device. Unnecessary electric field peaks may be detrimental to the short- and long-term stability of the device.

This purpose is reached by providing a semiconductor device of the type defined in the introduction in which the pn junction and its JTE are covered by an epitaxially grown third layer.

One aspect of the invention includes of a planar structure semiconductor device which comprises a pn junction. Both a p-conducting layer and an n-conducting layer forming the pn junction consist of doped silicon carbide. The edge of the higher doped conducting layer of the pn junction exhibits a charge profile with a stepwise or uniformly decreasing effective sheet charge density. The effective sheet charge density is radially decreasing from an initial value at the periphery of a main junction area to a zero or almost zero effective sheet charge density at the outermost edge of a junction extension. Characteristic of the invention is that the mentioned pn junction with its junction termination extension is buried under an epitaxially grown layer of doped or undoped SiC.

The effective sheet charge density is equal to the integral of the volume doping concentration over the thickness of the JTE zone or epitaxial layer. In the case of constant doping concentration, the effective sheet charge density is equal to the product of the doping concentration and the thickness of the doped layer.

By manufacturing a device with the above features a damage free epitaxial layer is provided for the passivation step in the manufacturing of, e.g., a transistor. The epitaxial layer will result in lower peaks in the electric field and reduced stress on the passivation layer.

Characteristic of the invention is that the epitaxially grown layer may be either p-conducting or n-conducting.

Another aspect of the invention is that the epitaxially grown layer may itself be used as a zone of the JTE. Thus, the number of process steps may be minimized for a given reduction of the electric field. Further aspects of the invention include the fact that a number of zones may be ion implanted into the epitaxially grown layer.

Yet another aspect of the invention is that the device may be covered with a passivating layer.

When manufacturing e.g. a MISFET, JFET, FCT (Field Controlled Thyristor) or an IGBT, the grown epitaxial layer may be used as the drift region, the base region or the channel region, depending on the device type.

Other aspects of the invention includes methods for producing the above-mentioned SiC semiconductor device.

DESCRIPTION OF EMBODIMENTS

The invention will be described in a number of embodiments with reference to the drawings.

Figure 1:
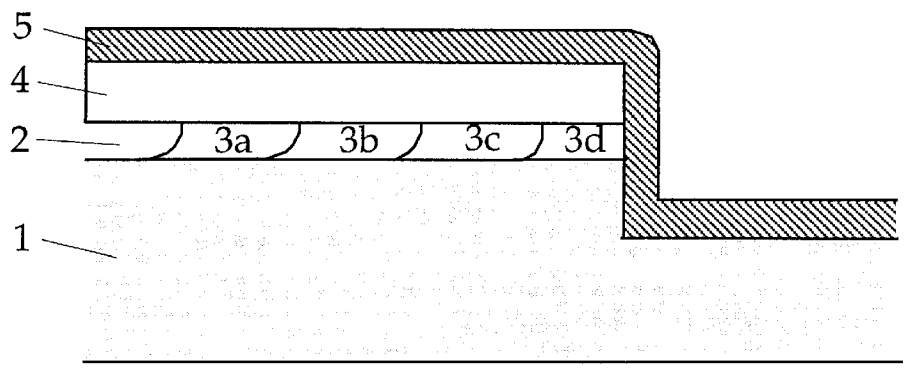
FIG. 1 shows a planar pn junction with ion implanted zones as a JTE of the device. The pn junction and its JTE are buried under an epitaxial layer being of the same conducting type as the JTE.

FIG. 1 illustrates a planar device having a JTE buried under an epitaxial layer, according to the invention. The semiconductor device is exemplified by a pn junction, where silicon carbide constitutes the base material.

The manufacturing of a planar JTE, as described below, is not new. The planar JTE as described below is included in the description of the invention to clarify the use of the invention.

Figure 4:
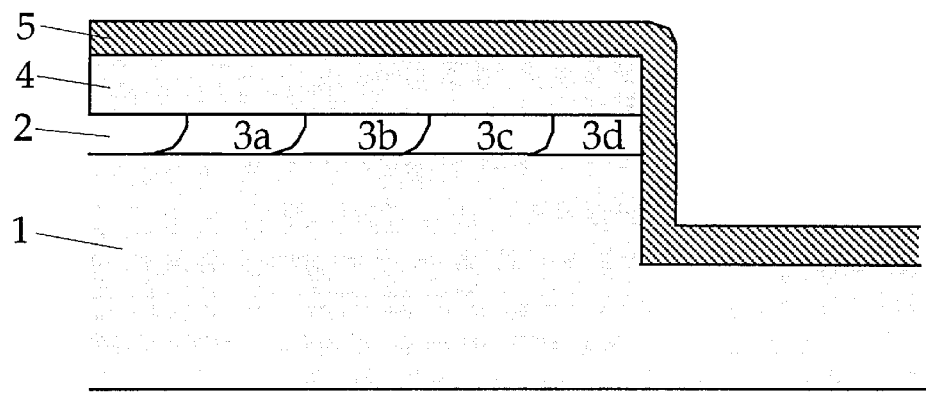
FIG. 4 shows a device similar to the one in FIG. 1, where the epitaxial layer is of the same conducting type as the substrate.

The devices shown in FIGS. 1 and 4 exemplify a first embodiment of the invention. The device in FIG. 1 is built on a substrate 1 consisting of doped p-conducting SiC. A highly doped p-conducting zone 2 is established employing ion implantation. As implants aluminum, boron or gallium can be used. The n-doped substrate 1 with its p-conducting zone 2 compose a pn-junction where zone 1 constitutes the first layer and zone 2 is a part of the second layer. In a second stage, a JTE 3 is formed employing masking of concentric zones followed by ion implantation. A first zone 3a of the JTE is formed by masking the entire area of the substrate outside zone 3a. During the following ion implantation, zone 3a will become p-doped and zone 2 will become more highly doped. In the next step, everything outside zone 3b is masked and the highly doped zone 2, zone 3a and zone 3b are ion implanted with the result that the resulting doping concentration of zone 3a will be higher than in zone 3b. The doping concentration of zone 3a is a result of two consecutive ion implantations. Further zones of the JTE extension 3c may be formed in consecutive steps by masking everything outside zone 3c followed by ion implantation. Alternatively, a reversed method may be employed. Thus, in a first stage the entire area of the JTE is left unmasked and is ion implanted with a dose equal to the final dose of the outermost zone 3d. In the next step, everything but the outermost zone is left unmasked and is ion implanted so that the total dose is equal to the final dose in the next to outermost zone but one. The masking is then repeated for all of the zones of the JTE.

In an alternative embodiment, the substrate 1 may be p-conducting and the implanted zone 2 with its JTE n-conducting.

The resulting charge density of the different zones of the JTE will be decreasing, in a direction from the pn junction to the edge of the device, from an initial value at the pn junction. At the zone boundaries of the JTE, the electric field will reach peak values during operation. The height of these peaks is dependent on the number of zones used and will decrease with an increasing number of zones. In the example above, the JTE consisted of 4 zones. The number of zones is ultimately dependent on the allowed number of process steps. After the JTE has been formed, an epitaxial p-doped layer 4 is grown on top of the device. As an alternative, the epitaxial layer may consist of n-doped material as shown in FIG. 4. One of the aspects of the invention is that a damage-free layer is supplied for the passivation step in which an optional passivating layer 5 is formed on the epitaxial layer. The passivating layer may consist of, e.g., SiO$_2$ or AlN.

Figure 2:
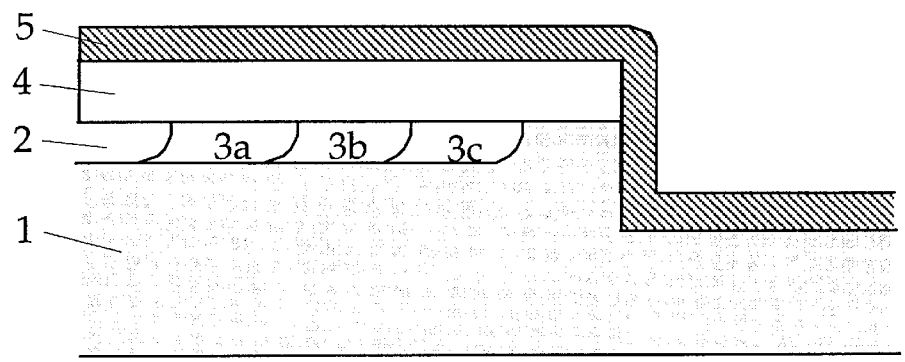
FIG. 2 shows a planar pn junction with ion implanted zones as parts of the JTE of the device. The pn junction is buried under an epitaxial layer being of the same conducting type as the JTE, where the epitaxially grown layer serves as the outermost zone of the JTE.

A second preferred embodiment of the invention is exemplified in FIG. 2. In this embodiment the areal extension of the JTE is smaller than the extension of the epitaxial layer covering zone 2 and its JTE 3a–3c. In forming the zones 3a–3c, the same methods as described above may be employed. The epitaxial layer, having a lower concentration of doping atoms than the last implanted zone of the JTE 3, itself serves as the outermost zone of the junction termination extension. In this embodiment the number of process steps is decreased compared with the first embodiment. This embodiment of the invention can also incorporate the passivating layer 5, for further reduction of the electric field, as described above. In this second embodiment, the epitaxial layer may consist of either n-doped or p-doped SiC.

Figure 3:
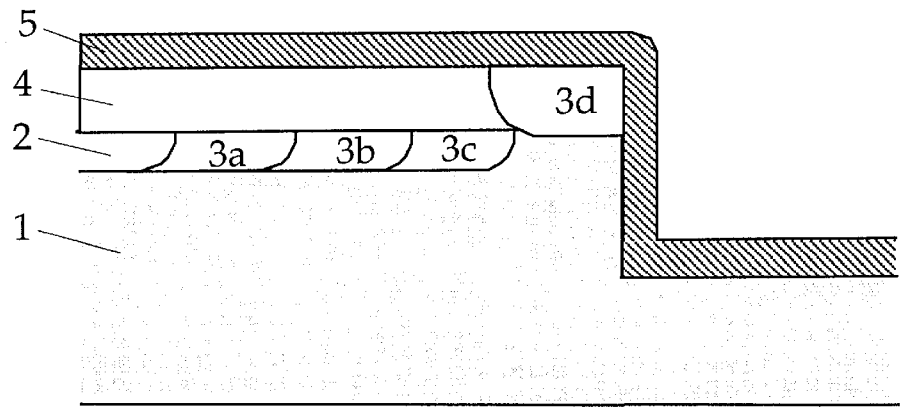
FIG. 3 shows a planar pn junction with ion implanted zones as parts of the JTE of the device. The pn junction is buried under an epitaxial layer being of the same conducting type as the JTE. The outermost zone of the JTE is implanted into the epitaxial layer.
Figure 5:
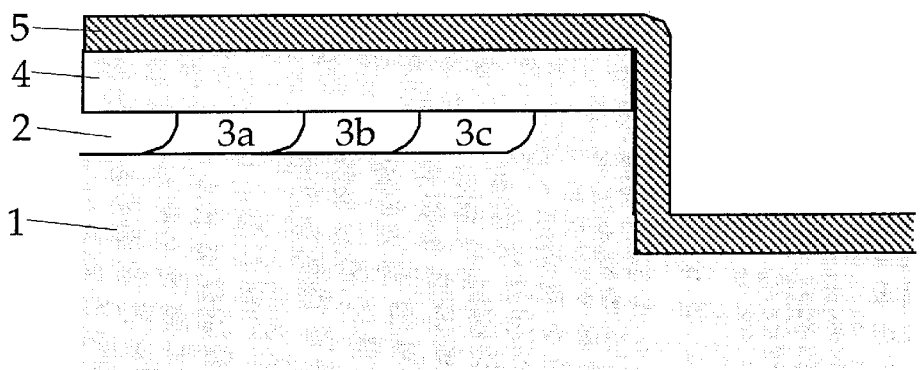
FIG. 5 shows a device similar to the one in FIG. 2, where the epitaxial layer is of the same conducting type as the substrate.
Figure 6:
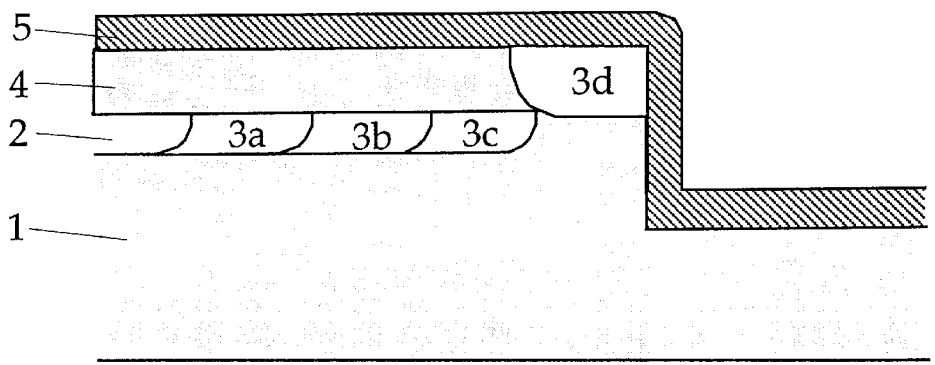
FIG. 6 shows a device similar to the one in FIG. 3, where the epitaxial layer is of the same conducting type as the substrate.

A third embodiment of the invention can be exemplified with reference to FIGS. 3 and 5. A device according to this embodiment can be arrived at by starting with the same steps as described above for the second preferred embodiment. After the growth of the epitaxial layer, a last zone 3d of the JTE is formed by ion implantation, of a dopant of the same conducting type as in zones 3a–3c, into the epitaxial layer. In this third embodiment, the epitaxial layer may consist of either n-doped or p-doped SiC.

The pn-junction and its JTE in the examples above may be a part of a buried grid in any of an MISFET, an IGBT, a JFET or an FCT where the epitaxially grown third layer constitutes a part of the drift region of the component.

The pn-junction and its JTE in the examples above may be a part of a buried grid in any of a JFET or an FCT where the epitaxially grown third layer constitutes a part of the channel region of said component.

Alternatively, the pn junction and its JTE in the examples above may be a part of a buried grid in any of an MISFET or an IGBT and the epitaxially grown third layer constitutes a part of the base region of the component.

In the figures the areal extension of the device is terminated by etching. A device according to the invention may also be terminated by an implanted channel stopper.

Figure 7:
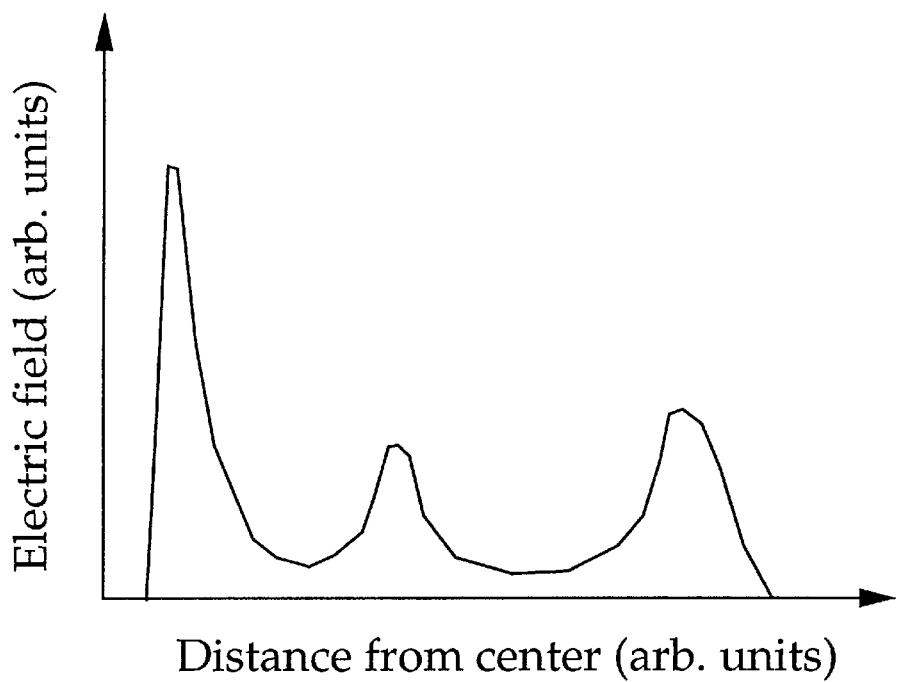
FIG. 7 shows the electric field at the surface of a device, as a function of the distance from the pn junction, without the epitaxially grown layer.
Figure 8:
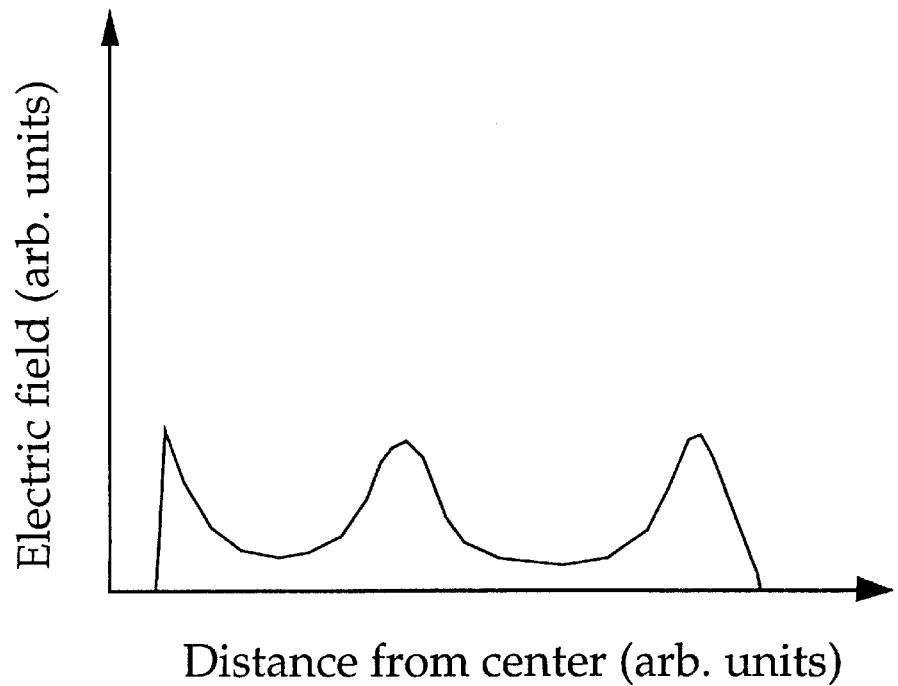
FIG. 8 shows the electric field at the surface of a device, as a function of the distance from the pn junction, for a two-zone JTE when an epitaxially grown layer is present.
Figure 9:
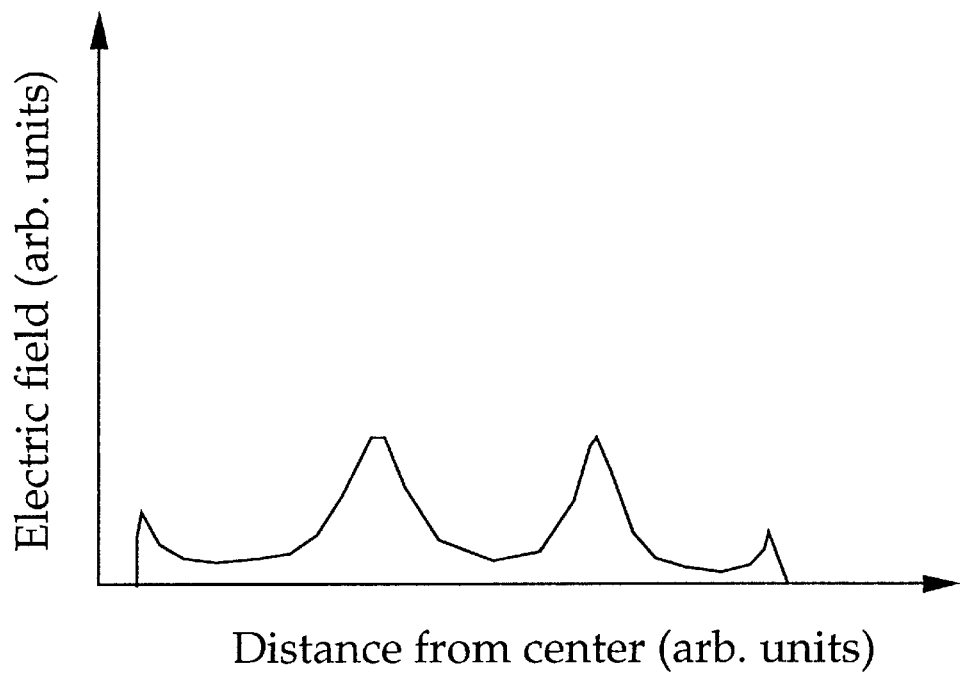
FIG. 9 shows the electric field at the surface of a device, as a function of the distance from the pn junction, for a three-zone JTE when the epitaxial layer constitutes the third zone.

FIG. 7 shows the electric field at the surface of a device, as a function of the distance from the pn junction, with a JTE as shown in FIG. 2, having only 2 zones, without the epitaxially grown layer 4. FIG. 8 shows the electric field at the surface of the device, as a function of the distance from the pn junction, for a JTE according to FIG. 5 having only 2 zones, when an epitaxially grown layer 4, of the opposite conducting type as the JTE, is present. It is evident from the figures that the epitaxially grown layer reduces the height of the peaks in the electric field at the surface of the device. FIG. 9 shows the electric field at the surface of the device, as a function of the distance from the pn junction, for a JTE according to FIG. 2 having only 3 zones, when the epitaxial layer, being of the same conducting type as the JTE, constitutes the third zone of the JTE.

Generally, for a four-zone JTE the charge densities may be varied according to the intervals of the relation $$Q_1:Q_2:Q_3:Q_4=(50-85):(30-60):(15-40):(5-25)$$

where $Q_1$ denotes the effective sheet charge density of the innermost zone of the JTE, $Q_2$ the next to the innermost zone 3b and so on. The value 100 corresponds to a doping so that the zone with this charge density is completely depleted at full design voltage. This charge density is called the characteristic charge density $Q_0$ and is expressed in Coulombs/cm$^2$.

With other alternative number of zones:

three zones: $Q_1:Q_2:Q_3=(40-85):(25-50):(5-35)$.

two zones: $Q_1:Q_2=(30-85):(5-50)$.

one zone: $Q_1=(30-80)$.

For a device with more than 4 zones in the JTE, the ranges as stated above may serve as a guidance.

The doping of the highly doped area of the pn junction being surrounded by the JTE may be several times higher than the characteristic effective sheet charge density $Q_0$.

The effective sheet charge density is equal to the integral of the volume doping concentration over the thickness of the JTE zone or epitaxial layer. In the case of constant doping concentration, the effective sheet charge density is equal to the product of the doping concentration and the thickness of the doped layer.

The term SiC is used in the following text to refer to any of the principal crystal polytypes of this material known as 6H, 4H, 2H, 3C and 15R.

We claim:

1. A planar semiconductor device comprising a pn junction formed of
    a first conducting type layer;
    a second conducting type layer arranged at a surface of the first conducting type layer, both layers being of doped silicon carbide (SiC) and wherein the second conducting type layer has a higher doping than the first conducting type layer, the second layer being provided with a junction termination extension (JTE) comprising stepwise decreasing effective sheet charge density in a direction from the second conducting type later towards the outer edge of the JTE; and
    a third SiC layer covering at least a part of both the second conducting type layer and the JTE.

2. A semiconductor device according to claim 1, wherein the third layer is of the first conducting type.

3. A semiconductor device according to claim 1, wherein the third layer is of the second conducting type.

4. A semiconductor device according to claim 3, wherein the third layer extends, in a direction radially outwards from the center of the junction, beyond the JTE of the second layer, and wherein the third layer serves as a zone of the JTE.

5. A semiconductor device according to claim 1, wherein the third layer extends, in a direction radially outwards from the center of the junction, beyond the JTE in the second layer, and wherein there is implanted a zone in the third layer contacting the outer edge of the JTE to constitute a prolongation thereof.

6. A semiconductor device according to claim 1, wherein the surface of the device is covered with a passivating layer.

7. A semiconductor device according to claim 1, wherein the pn junction and the JTE are a part of a buried grid in any of a MISFET, an IGBT, a JFET and an FCT and wherein the third layer constitutes a part of the channel region of said component.

8. A semiconductor device according to claim 1, wherein the pn junction and the JTE are a part of a buried grid in any of a JFET and an FCT and wherein the third layer constitutes a part of the channel region of said component.

9. A semiconductor device according to claim 1, wherein the pn junction and the JTE are part of a buried grid in any of a MISFET and an IGBT and said third layer constitutes a part of the base region of said component.

10. A planar semiconductor device comprising a pn junction formed of
    a first conducting type layer;
    a second conducting type layer arranged at a surface of said first conducting type layer, both layers being of doped silicon carbide (SiC) and wherein the second conducting type layer has higher doping than the first conducting type layer, the second layer being provided with a junction termination extension (JTE) comprising stepwise decreasing effective sheet charge density in a direction from the second conducting type layer towards the outer edge of the JTE; and a third epitaxially grown SiC layer covering at least a part of both the second conducting type layer and the JTE.

11. A semiconductor device according to claim 10, wherein the third layer is of the first conducting type.

12. A semiconductor device according to claim 10, wherein the third layer is of the second conducting type.

13. A semiconductor device according to claim 12, wherein the third layer extends, in a direction radially outwards from the center of the junction, beyond the JTE of the second layer, and wherein the third layer serves as a zone of the JTE.

14. A semiconductor device according to claim 10, wherein the third layer extends, in a direction radially outwards from the center of the junction, beyond the JTE in the second layer, and wherein there is implanted a zone in the third layer contacting the outer edge of the JTE to constitute a prolongation thereof.

15. A semiconductor device according to claim 10, wherein the pn junction and the JTE are a part of a buried grid in any of a MISFET, an IGBT, a JFET and an FCT and wherein the third layer constitutes a part of the channel region of said component.

16. A semiconductor device according to claim 10, wherein the pn junction and the JTE are part of a buried grid in any of a MISFET and an IGBT and said third layer constitutes a part of the base region of said component.

* * * * *